(12) United States Patent
Yu et al.

(10) Patent No.: US 8,952,760 B2
(45) Date of Patent: Feb. 10, 2015

(54) GATED VOLTAGE-CONTROLLED OSCILLATOR AND CLOCK AND DATA RECOVERY CIRCUIT

(71) Applicants: Global Unichip Corp., Hsinchu (TW); Taiwan Semiconductor Manufacturing Co., Ltd., Hsin-Chu (TW)

(72) Inventors: Po-Shing Yu, Hsinchu (TW); Chia-Hsiang Chang, Hsinchu (TW); Ting-Hao Wang, Hsinchu (TW)

(73) Assignees: Global Unichip Corp., Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 63 days.

(21) Appl. No.: 13/723,430

(22) Filed: Dec. 21, 2012

(65) Prior Publication Data

US 2013/0169326 A1 Jul. 4, 2013

(30) Foreign Application Priority Data

Jan. 3, 2012 (TW) .............................. 101100138 A

(51) Int. Cl.
*H03K 3/03* (2006.01)
*H03L 7/00* (2006.01)
*H03K 3/36* (2006.01)
*H03L 7/24* (2006.01)

(52) U.S. Cl.
CPC .. *H03L 7/00* (2013.01); *H03K 3/36* (2013.01); *H03K 3/0315* (2013.01); *H03L 7/24* (2013.01)
USPC ................. 331/57; 331/45; 331/50; 331/135; 327/155

(58) Field of Classification Search
CPC .......... H03K 3/0315; H03K 3/36; H03L 7/00; H03L 7/24
USPC ......................... 331/57, 45, 50, 135; 327/155
See application file for complete search history.

(56) References Cited

U.S. PATENT DOCUMENTS

| | | | | |
|---|---|---|---|---|
| 7,302,026 | B2* | 11/2007 | Kaeriyama et al. | 375/355 |
| 7,522,686 | B2* | 4/2009 | Nam et al. | 375/355 |
| 2010/0182064 | A1* | 7/2010 | Shin | 327/262 |
| 2011/0221272 | A1* | 9/2011 | Koyama et al. | 307/42 |

* cited by examiner

*Primary Examiner* — Arnold Kinkead
*Assistant Examiner* — Richard Tan
(74) *Attorney, Agent, or Firm* — McClure, Qualey & Rodack, LLP

(57) ABSTRACT

A gated voltage-controlled oscillator receives a gating signal and outputs an oscillating signal having a frequency corresponding to the gating signal. The gated voltage-controlled oscillator includes a delay unit, having a first terminal and a second terminal, and a multiplexer, having a first input terminal, a second input terminal, a select terminal and an output terminal. The first input terminal and the select terminal are coupled to the gating signal. The second input terminal is coupled to the first terminal of the delay unit. The output terminal outputs the oscillating signal and is coupled to the second terminal of the delay unit. The delay unit delays the oscillating signal and outputs the delayed oscillating signal into the second input terminal. The multiplexer outputs a signal of the first input terminal or the second input terminal according to the gating signal.

6 Claims, 7 Drawing Sheets

GATED VOLTAGE-CONTROLLED OSCILLATOR AND CLOCK AND DATA RECOVERY CIRCUIT

CROSS REFERENCE TO RELATED APPLICATIONS

This application claims priority of Taiwan Patent Application No. 101100138, filed on Jan. 3, 2012, the entirety of which is incorporated by reference herein.

BACKGROUND OF THE INVENTION

1. Field of the Invention

The invention relates to a clock and data recovery circuit and more particularly to a gated voltage-controlled oscillator.

2. Description of the Related Art

A CDR (Clock and Data Recovery) circuit is used to retrieve a clock signal synchronized with the phase of the input data and perform data regeneration according to phase synchronization information.

FIG. 1a is a block diagram of a CDR circuit 10 in prior arts. The CDR circuit 10 comprises an edge detector 110, a gated voltage-controlled oscillator (GVCO) 120, and a D flip-flop (DFF) 130. The edge detector 110 comprises a delayer 112, an exclusive-or (XOR) gate 114, and an inverter 116. The edge detector 110 receives input data DI and generates a gating signal GS which is synchronized with the ascending phase or the descending phase of the input data DI. The GVCO 120 performs instantaneous phase realignment according to the gating signal GS to oscillate a clock signal CLK corresponding to the input data DI. The DFF 130 receives the clock signal CLK from the GVCO 120 and recovers data from the input data DI to output recovered data DO.

FIG. 1b is an example of a waveform diagram of the CDR circuit 10 in FIG. 1a. The waveform 1 is the waveform of the input data DI. The waveform 2 is the output waveform of the delayer 112 in FIG. 1a by which the input data DI is delayed for T/2. The waveform 3 is the output waveform of the XOR gate 114. Pulses of the waveform 3 correspond to ascending or descending edges of the input data DI. The waveform 4, the waveform of the gating signal GS, is an inverse of the waveform 3. The waveform 5 is the output waveform of the GVCO 120 in FIG. 1a. That is, the waveform 5 is the waveform of the clock signal CLK.

FIG. 1c is a block diagram of the GVCO 120 in FIG. 1a. Typically, the GVCO 120 comprises an NAND gate 122 and inverters 124-1~124-n. One input terminal of the NAND gate 122 receives the gating signal GS. The other input terminal is coupled to the output terminal of the GVCO 120. The output terminal of the NAND gate 122 is coupled to serially-connected inverters 124-1~124-n. The serially-connected inverters 124-1~124-n become a delay unit. FIG. 1d is an example of the circuit diagram of the NAND gate 122 in FIG. 1c. As shown in FIG. 1d, when the NAND gate 122 is operated, there is asymmetry.

Moreover, the output clock signal may have unnecessary jitter when the NAND gate is used to constitute the GVCO. For avoiding unnecessary jitter, the bandwidth of the NAND gate is usually increased. However, the bandwidth is limited in the normal CMOS manufacturing process. In addition, the operating current has to be increased when the bandwidth is increased, and thus the circuit area is enlarged.

BRIEF SUMMARY OF THE INVENTION

In view of this, in the invention, a multiplexer takes the place of the NAND gate of the traditional gated voltage-controlled oscillator.

In one embodiment, the invention provides a gated voltage-controlled oscillator, receiving a gating signal and outputting an oscillating signal having a frequency corresponding to the gating signal, comprising: a delay unit, having a first terminal and a second terminal; and a multiplexer, having a first input terminal, a second input terminal, a select terminal and an output terminal, wherein the first input terminal and the select terminal are coupled to the gating signal, the second input terminal is coupled to the first terminal of the delay unit, the output terminal outputs the oscillating signal and is coupled to the second terminal of the delay unit, the delay unit delays the oscillating signal and outputs the delayed oscillating signal into the second input terminal, and the multiplexer outputs a signal of the first input terminal or the second input terminal according to the gating signal.

In another embodiment, the invention provides a data recovery circuit, receiving input data and outputting recovery data according to the input data and a clock signal synchronized with the phase of the input data, comprising: an edge detecting circuit, receiving the input data and output a gating signal; a gated voltage-controlled oscillator, receiving the gating signal and outputting the clock signal, comprising: a delay unit, having a first terminal and a second terminal; and a multiplexer, having a first input terminal, a second input terminal, a select terminal and an output terminal, wherein the first input terminal and the select terminal are coupled to the gating signal, the second input terminal is coupled to the first terminal of the delay unit, the output terminal outputs the clock signal and is coupled to the second terminal of the delay unit, the delay unit delays the clock signal and outputs the delayed clock signal into the second input terminal, and the multiplexer outputs a signal of the first input terminal or the second input terminal according to the gating signal; and a D flip-flop, receiving the input data and the clock signal and outputting the recovery data.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 1b is an example of a waveform diagram of the CDR circuit in FIG. 1a;

FIG. 1c is a block diagram of the gated voltage-controlled oscillator in FIG. 1a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
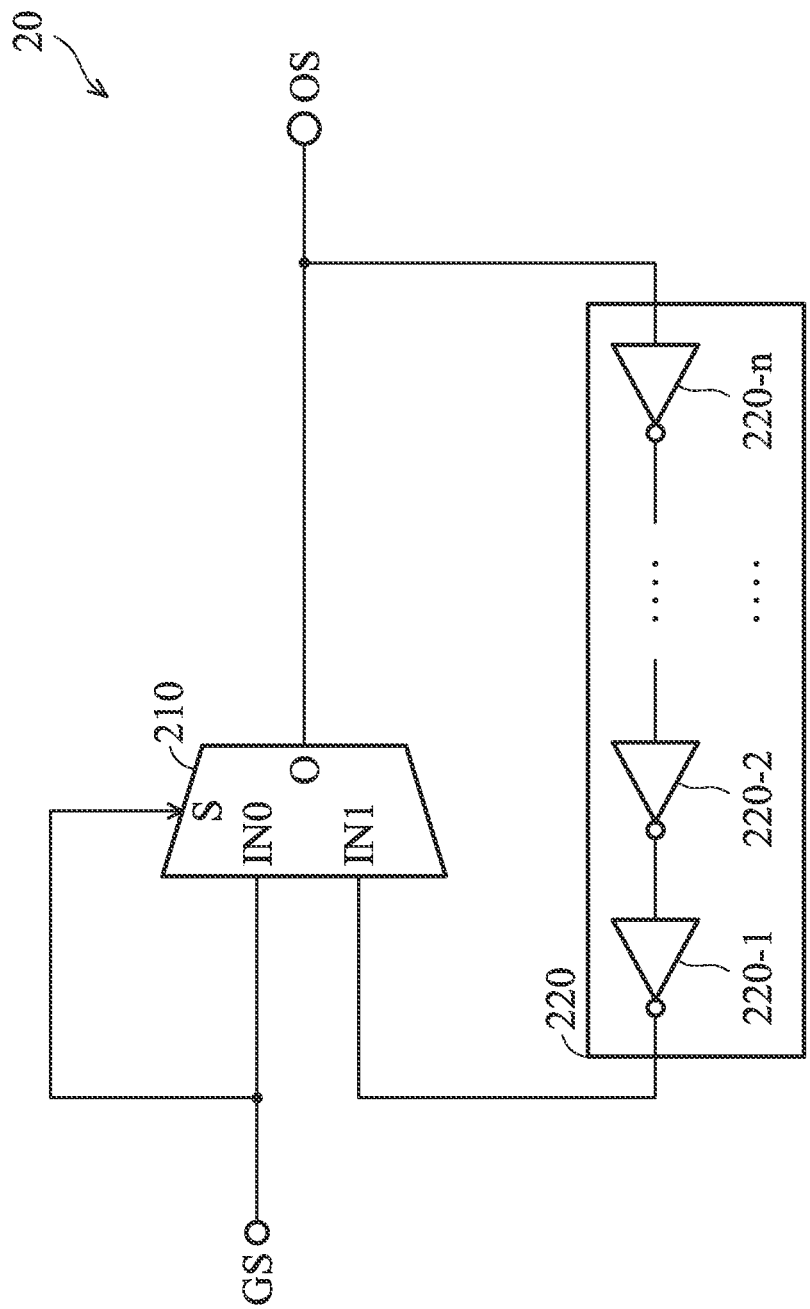
FIG. 2 is a block diagram of a gated voltage-controlled oscillator according to an embodiment of the invention.

FIG. 2 is a block diagram of a gated voltage-controlled oscillator (GVCO) 20 according to an embodiment of the invention.

The GVCO 20 comprises a multiplexer 210 and a delay unit 220. The delay unit 220 comprises serially connected inverters 220-1~220-n. Note that the delay unit 220 is not limited to being constituted by inverters. Other components may be used to constitute the delay unit. For example, the delay unit may be a buffer. The multiplexer 210 is a 2-to-1 multiplexer. The multiplexer 210, comprising input terminals IN0 and IN1, a select terminal S, and an output terminal O, selectively outputs a signal from one of the input terminals IN0 and IN1 according to the select signal received from the select terminal S. For example, when the select signal is at a low voltage level (logic '0'), the multiplexer 210 outputs the signal from the input terminal IN0. When the select signal is at a high voltage level (logic '1'), the multiplexer 210 outputs the signal from the input terminal IN1.

In the embodiment, the input terminal IN0 of the multiplexer 210 is coupled to a gating signal GS, and the input terminal IN1 is coupled to the output terminal of the delay unit 220. The select terminal S of the multiplexer is coupled to the input terminal IN0. That is, both the select terminal S and the input terminal IN0 receive the gating signal GS. The multiplexer 210 selectively outputs a signal from one of the input terminals IN0 and IN1 according to the gating signal GS. Therefore, when the multiplexer 210 receives the descending edges of the gating signal GS, the multiplexer 210 directly outputs the gating signal GS. When the multiplexer 210 receives the ascending edges of the gating signal GS, the multiplexer 210 outputs the output signal of the delay unit 220. Thus, an oscillating signal OS is generated.

Figure 1A:
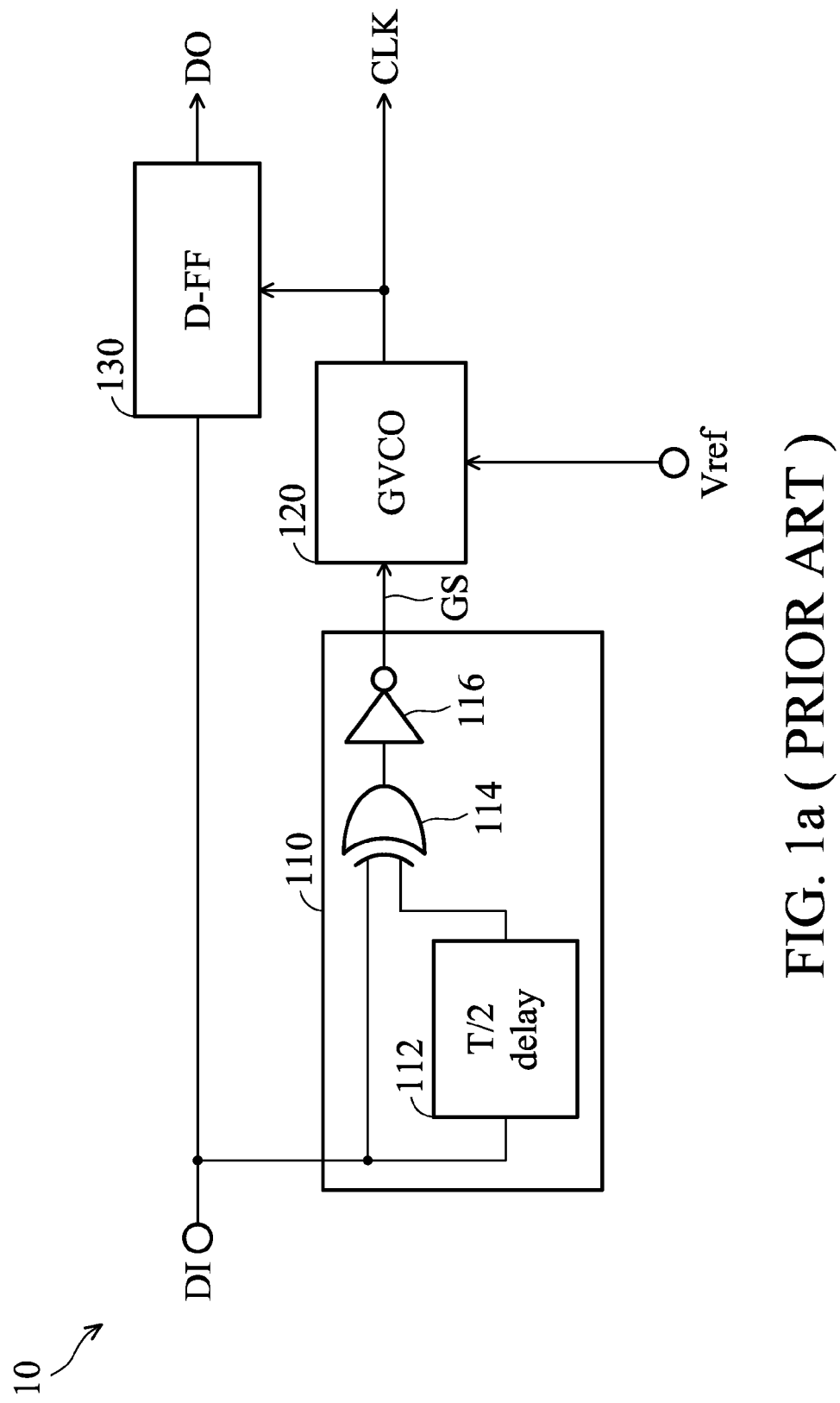
FIG. 1a is a block diagram of a clock data recovery (CDR) circuit in prior arts.
Figure 1B:
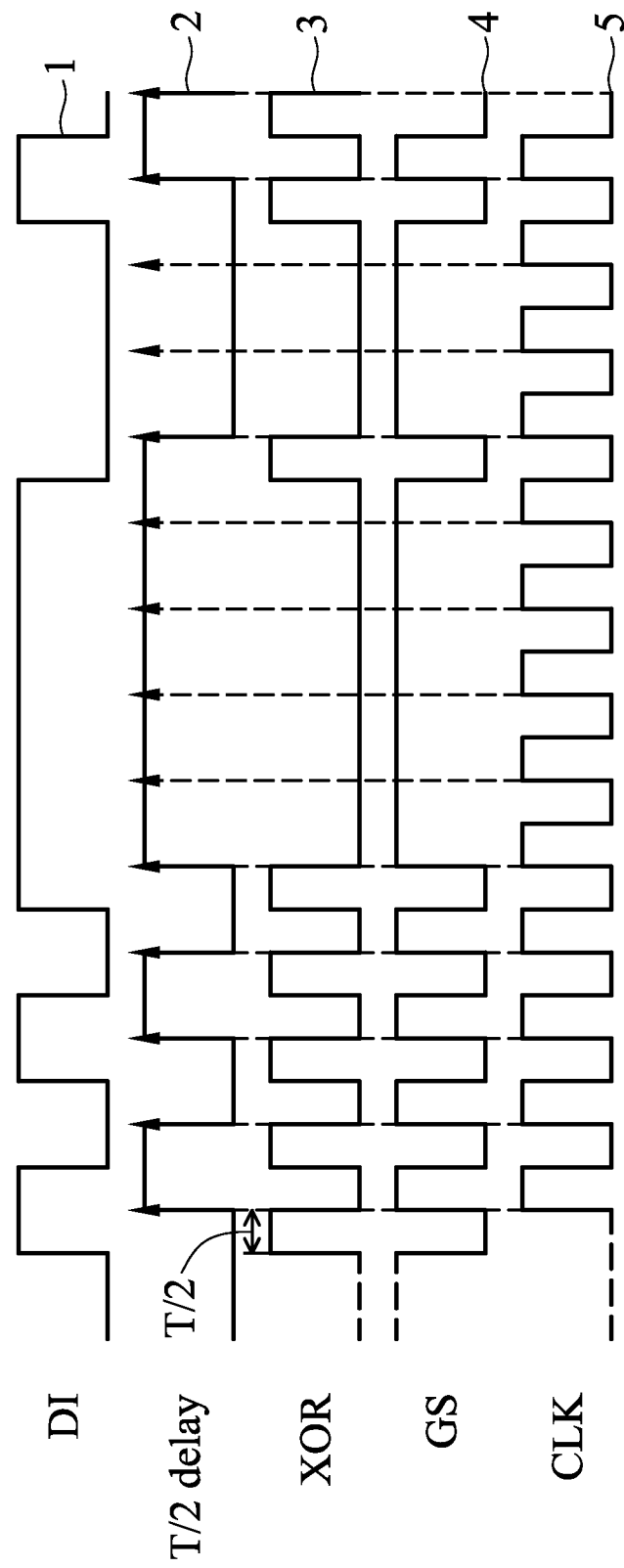
Figure 1C:
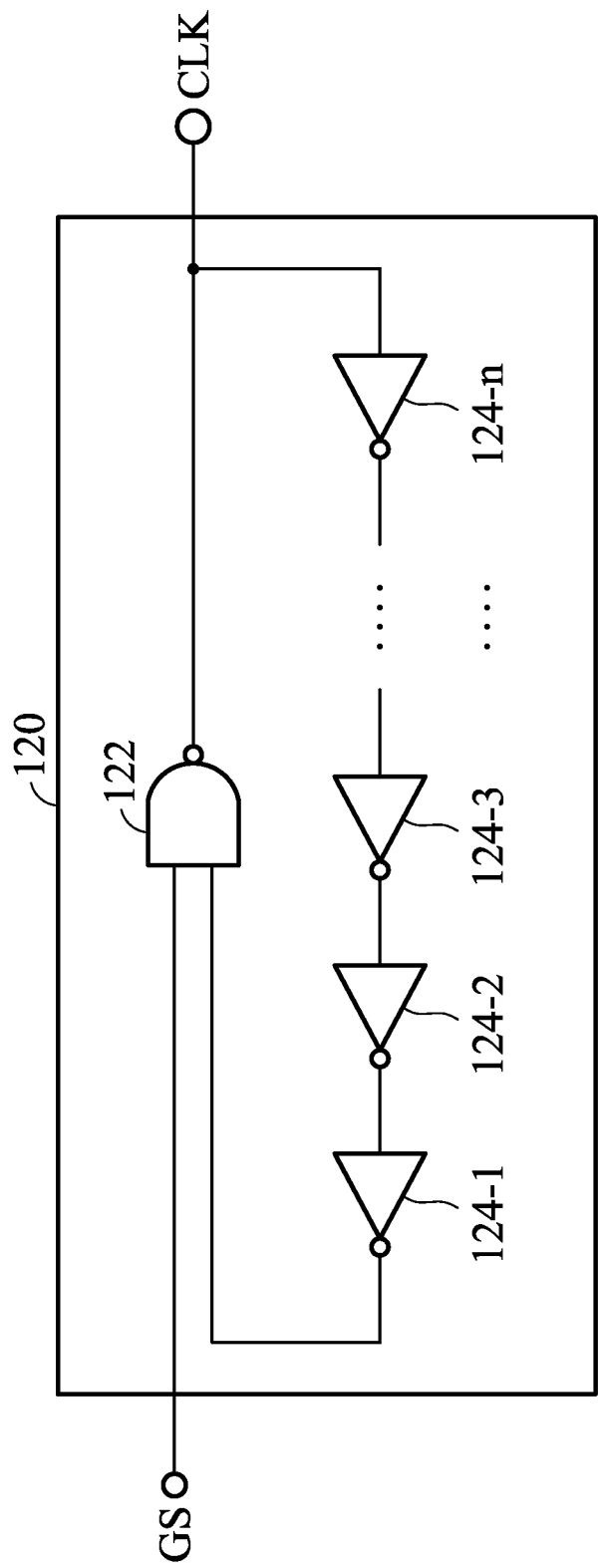
Figure 1D:
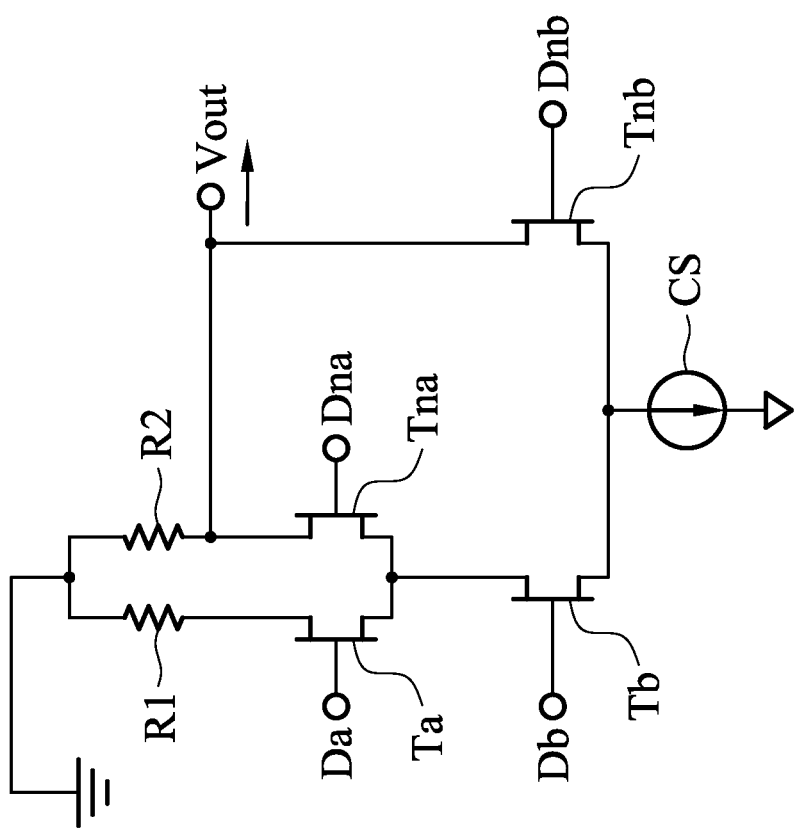
FIG. 1d is an example of the circuit diagram of the NAND gate in FIG. 1c.
Figure 3:
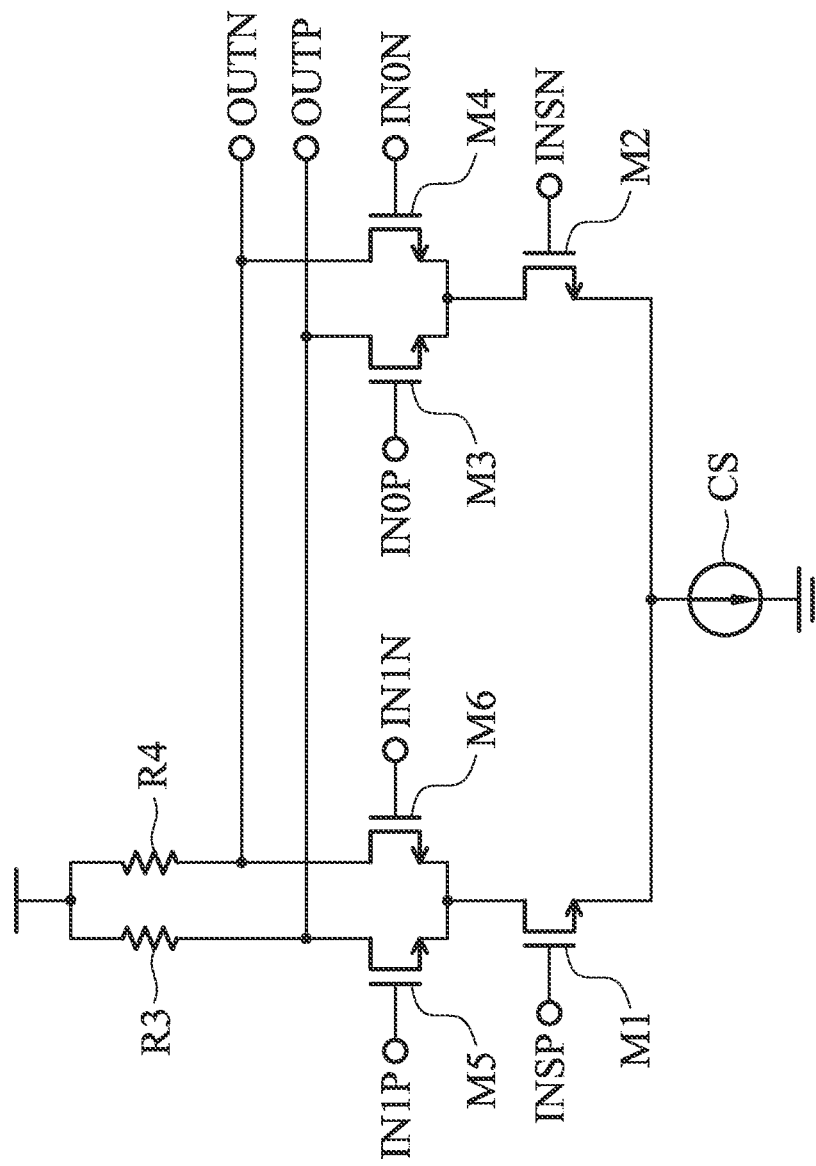
FIG. 3 is a circuit diagram of a multiplexer of a gated voltage-controlled oscillator according to an embodiment of the invention.

FIG. 3 is an example of the circuit diagram of the multiplexer 210 of the GVCO 20 according to an embodiment of the invention. Terminals INSP/INSN are the select terminal S. Terminals IN0P/IN0N are the input terminal IN0. Terminals IN1P/IN1N are the input terminal IN1. Terminals OUTP/OUTN are the output terminal O. When the multiplexer 210 receives the descending edges of the gating signal GS, the terminal INSP is at a low voltage level, the terminal INSN is at a high voltage level, the MOS (Metal Oxide Semiconductor) element M1 is off, and the MOS element M2 is on. When the multiplexer 210 receives the ascending edges of the gating signal GS, the terminal NSP is at a high voltage level, the terminal INSN is at a low voltage level, the MOS element M1 is on, and the MOS element M2 is off. Therefore, when the multiplexer 210 as shown in FIG. 3 is used to constitute the GVCO, the symmetry of the multiplexer is better than that of the NAND gate in FIG. 1d.

Figure 4:
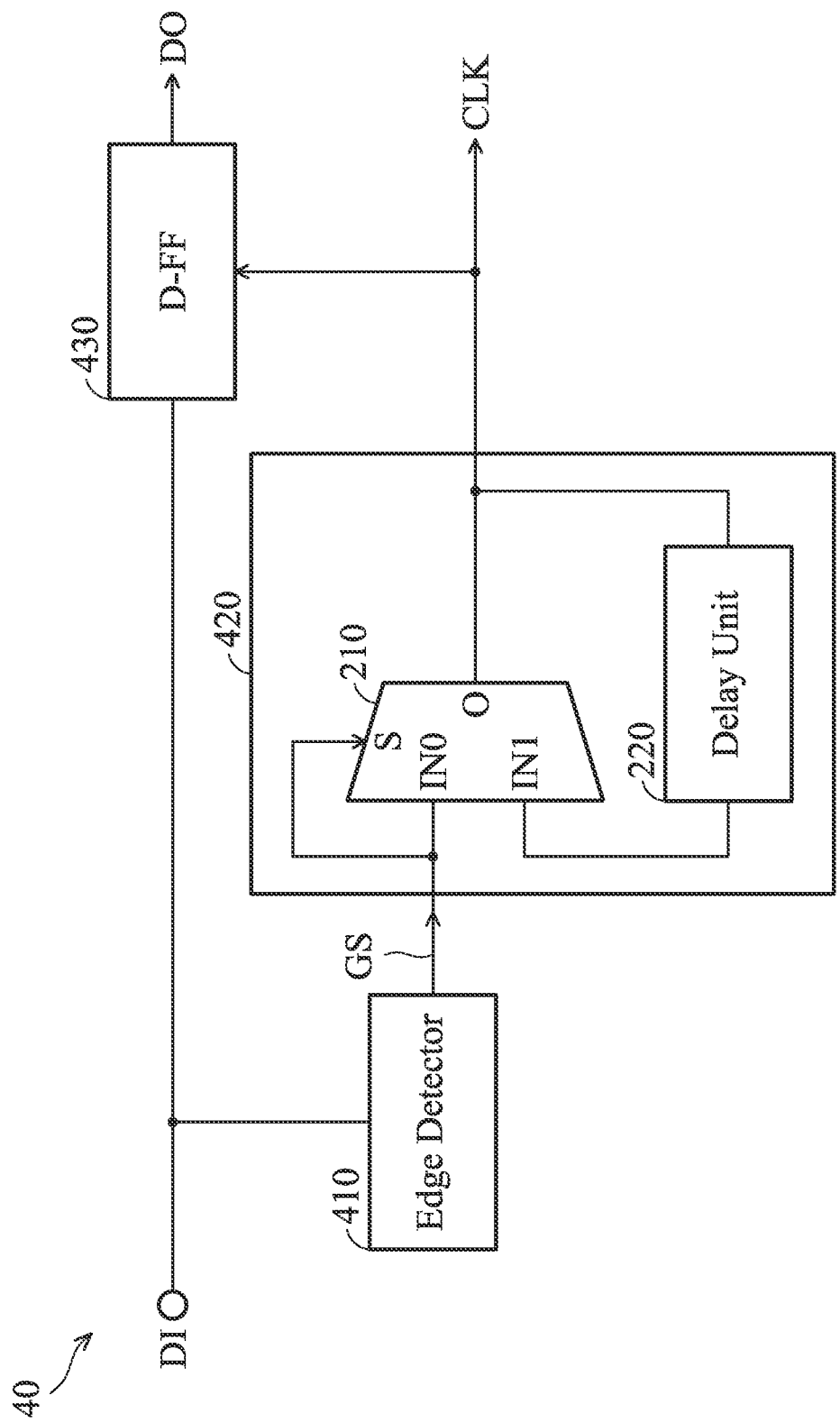
FIG. 4 is a block diagram of a data recovery circuit according to an embodiment of the invention.

FIG. 4 is a block diagram of a data recovery circuit 40 according to an embodiment of the invention. The data recovery circuit 40 comprises an edge detector 410, a GVCO 420 and a D flip-flop 430. The edge detector 410 receives input data DI and generates a gating signal GS which is synchronized with the ascending phase or the descending phase of the input data DI. The GVCO 420 performs instantaneous phase realignment according to the gating signal GS and oscillates a clock signal CLK corresponding to the input data DI. The D flip-flop 430 receives the clock signal CLK from the GVCO 120, recovers data from the input data DI according to the clock signal CLK and outputs recovered data DO.

The GVCO 420, the same as the GVCO 20 in FIG. 2, comprises a multiplexer 210 and a delay unit 220. The input terminal IN0 of the multiplexer is coupled to the gating signal GS, and the input terminal IN1 is coupled to the output terminal of the delay unit 220. The select terminal S is coupled to the input terminal IN0. That is, the select terminal S is coupled to the gating signal GS. The multiplexer 210 selectively outputs a signal from one of the input terminals IN0 and IN1 according to the gating signal GS. Therefore, when the multiplexer 210 receives the descending edges of the gating signal GS, the multiplexer 210 directly outputs the gating signal GS. When the multiplexer 210 receives the ascending edges of the gating signal GS, the multiplexer 210 outputs the signal delayed by the delay unit 220. Thus, an oscillating signal OS is generated. Though the select terminal S is coupled to the input terminal IN0 in the embodiment, the invention is not limited thereto. In another example, the select terminal S is coupled to the input terminal IN1 and the select terminal S and the input terminal IN1 are coupled to the gating signal GS, and the input terminal IN0 is coupled to the output terminal of the delay unit 220. It depends on the design of the edge detector 410 in the front end.

As described above, the invention provides a gated voltage-controlled oscillator constituted by a multiplexer and a clock and data recovery circuit comprising the gated voltage-controlled oscillator. Moreover, the gated voltage-controlled oscillator in the invention has better symmetry than that of the gated voltage-controlled oscillator constituted by the NAND gate in prior arts.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A gated voltage-controlled oscillator, receiving a gating signal and outputting an oscillating signal having a frequency corresponding to the gating signal, comprising:
   a delay unit, having a first terminal and a second terminal; and
   a multiplexer, having a first input terminal, a second input terminal, a select terminal and an output terminal, wherein the first input terminal and the select terminal are coupled to the gating signal, the second input terminal is coupled to the first terminal of the delay unit, the output terminal outputs the oscillating signal and is coupled to the second terminal of the delay unit, the delay unit delays the oscillating signal and outputs the delayed oscillating signal into the second input terminal, and the multiplexer outputs a signal of the first input terminal or the second input terminal according to the gating signal, wherein the first input terminal is directly connected to the select terminal.

2. The gated voltage-controlled oscillator as claimed in claim 1, wherein the delay unit further comprises at least one inverter, and when there is more than one inverter, the inverters are connected in serial.

3. The gated voltage-controlled oscillator as claimed in claim 1, wherein the delay unit further comprises at least one buffer, and when the number of the at least one buffer is more than one, the at least one buffer are connected in serial.

4. A data recovery circuit, receiving an input data and outputting a recovery data according to the input data and a clock signal synchronized with a phase of the input data, comprising:
   an edge detector, receiving the input data and output a gating signal;
   a gated voltage-controlled oscillator, receiving the gating signal and outputting the clock signal, comprising:

a delay unit, having a first terminal and a second terminal; and a multiplexer, having a first input terminal, a second input terminal, a select terminal, and an output terminal, wherein the first input terminal and the select terminal are coupled to the gating signal, the second input terminal is coupled to the first terminal of the delay unit, the output terminal outputs the clock signal and is coupled to the second terminal of the delay unit, the delay unit delays the clock signal and outputs the delayed clock signal into the second input terminal, and the multiplexer outputs a signal of the first input terminal or the second input terminal according to the gating signal, wherein the first input terminal is directly connected to the select terminal; and a D flip-flop, receiving the input data and the clock signal and outputting the recovery data.

5. The data recovery circuit as claimed in claim 4, wherein the delay unit further comprises at least one inverter, and when there is more than one inverter, the inverters are connected in serial.

6. The data recovery circuit as claimed in claim 4, wherein the delay unit further comprises at least one buffer, and when there is more than one buffer, the buffers are connected in serial.

* * * * *